United States Patent
Park

(10) Patent No.: US 7,729,172 B2
(45) Date of Patent: Jun. 1, 2010

(54) METHOD OF PROGRAMMING A NAND FLASH MEMORY DEVICE

(75) Inventor: Seong Je Park, Sacheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 3 days.

(21) Appl. No.: 12/276,777

(22) Filed: Nov. 24, 2008

(65) Prior Publication Data

US 2009/0080262 A1   Mar. 26, 2009

Related U.S. Application Data

(62) Division of application No. 11/617,673, filed on Dec. 28, 2006, now Pat. No. 7,466,598.

(30) Foreign Application Priority Data

Sep. 29, 2006   (KR) ............................... 2006-96243

(51) Int. Cl.
    *G11C 11/34* (2006.01)
    *G11C 16/04* (2006.01)
(52) U.S. Cl. ............................ 365/185.17; 365/185.28
(58) Field of Classification Search ............ 365/185.17, 365/185.28
    See application file for complete search history.

(56) References Cited

U.S. PATENT DOCUMENTS

| 7,382,660 B2 | 6/2008 | Bovino et al. |
| 7,548,457 B2 * | 6/2009 | Kang et al. ............. 365/185.03 |
| 2003/0198084 A1 * | 10/2003 | Fujisawa et al. ........ 365/185.11 |
| 2005/0228962 A1 * | 10/2005 | Takase et al. ................ 711/168 |
| 2007/0171726 A1 | 7/2007 | Kang et al. |
| 2007/0263446 A1 | 11/2007 | Chen |

FOREIGN PATENT DOCUMENTS

| JP | 2005-025898 A | 1/2005 |
| KR | 10-2000-0044591 A | 7/2000 |
| KR | 10-2001-0082527 A | 8/2001 |
| KR | 10-2005-0094569 A | 9/2005 |

* cited by examiner

*Primary Examiner*—Ly D Pham
(74) *Attorney, Agent, or Firm*—Townsend and Townsend and Crew LLP

(57) ABSTRACT

A method of programming a NAND flash memory device includes providing a flash memory device, wherein word lines are disposed between a drain selecting line and a source selecting line, wherein a first word line is provided adjacent to the source selecting line and a last word line is provided adjacent to the drain selecting line; and selecting a word line to program memory cells coupled to the selected word line to perform an even LSB program operation and an odd LSB program operation for the selected first word line. Each of the word lines is selected until all of the word lines have been selected, so that the even LSB program operation and the odd LSB program operation can be performed for all of the word lines. The even LSB program operation is performed to store a lower rank data bit in memory cells coupled to an even bit line assigned a selected word line. The odd LSB program operation is performed to store a lower rank data bit in memory cells coupled to an odd bit line assigned to the selected word line.

6 Claims, 3 Drawing Sheets

METHOD OF PROGRAMMING A NAND FLASH MEMORY DEVICE

CROSS-REFERENCE TO RELATED APPLICATIONS

The present application is a division of U.S. patent application Ser. No. 11/617,673, filed on Dec. 28, 2006, which claims priority to Korean patent application number 2006-96243, filed on Sep. 29, 2006, which is incorporated by reference in its entirety.

This application claims priority from Korean Patent Application No. 2006-96243, filed on Sep. 29, 2006, the contents of which are incorporated herein by reference in its entirety.

BACKGROUND OF THE INVENTION

The present invention relates to a method of programming a NAND multi-level cell flash memory device, and more particularly to a method of programming that reduces the interference between cells.

A semiconductor memory device is generally divided into a volatile memory device and a non-volatile memory device. In the volatile memory device, data is erased when the supply of power is stopped. In the non-volatile memory device, data is maintained even though the supply of power is stopped.

Recently, the non-volatile flash memory device has become widely used. The two main types of flash memory device is a NOR flash memory and a NAND flash memory. The NOR flash memory has excellent random access time characteristics because memory cells are independently connected to bit lines and word lines. Whereas, in the NAND flash memory, only one contact is required for one cell string because memory cells are connected in series, and so the NAND flash memory has excellent characteristics for integration. Recently, the demand for high density flash memory has increased, and thus the NAND flash memory having high degree of integration has been widely employed as the flash memory device of choice.

A single level cell (hereinafter, referred to as "SLC") is employed when storing 1 bit data in a memory cell. A multi-level cell (hereinafter, referred to as "MLC") is employed for storing data of 2 bits or more in a memory cell. Recently, because of the need for a flash memory device having a high degree of integration, the MLC has been actively studied.

The MLC generally has at least four threshold voltage levels, and also has four or more data storing conditions corresponding to the threshold voltage levels.

A typical MLC has four data storing conditions, e.g. '11', '10', '00' and '01'. Here, when the four data storing conditions corresponds to one of the threshold voltage levels, a 2 bit data can be stored in a memory cell.

The MLC is programmed by a Fowler-Nordheim tunneling phenomenon. A program voltage is applied to a row of gates of a selected cell, and a ground voltage Vss is provided to the channels of the selected cell. Accordingly, a high electric field is formed between a floating gate of a programmed cell and a channel.

FIG. 1 is a view illustrating a method of programming a common flash memory device. The MLC stores data of 2 bits or more, wherein the bits are divided into a most significant bit (hereinafter, referred to as "MSB"), and a least significant bit (hereinafter, referred to as "LSB"). For example, when storing the binary value '10', the MSB and LSB are 1 and 0, respectively.

Accordingly, in case that LSB is programmed in '11', data storing condition '11' is converted into data storing condition '10'. Subsequently, to program MSB, the programming result of LSB is detected, and then the MSB is programmed in accordance with the detecting result.

For instance, if LSB is detected to be 1, data storing condition is '11'. Accordingly, in case of programming the MSB, data storing condition becomes '01'. If, on the other hand, LSB is detected to be 0, data storing condition is '10'. Accordingly, in case of programming the MSB, data storing condition becomes '00'.

However, since the MLC has more threshold voltage levels than the SLC (i.e., four instead of two), the read margin between the threshold voltage states for the MLC becomes more important.

Generally, the factors for causing interference between adjacent cells and changing the threshold voltage occurs commonly in NAND flash memory. The change in the threshold voltage increases as the flash memory devices become highly integrated and the density increases. The device characteristics of the flash memory are deteriorated.

In addition, comparing A of FIG. 2B to A of FIG. 2A, the threshold voltage distribution of the cell is increased due to the interference, and thus a pass voltage Vpass in FIG. 2B needs to be increased so that the cells have the same read margins as shown in B and C of FIGS. 2A and 2B. However, read disturb will occur due to the increase of the pass voltage Vpass.

In one embodiment, a method of programming a NAND flash memory device includes providing a flash memory device where N word lines are disposed between a drain selecting line and a source selecting line, each word line being assigned with a first bit line and a second bit line; performing an LSB program operation for storing a lower rank data bit from a first word line adjacent to the source selecting line to an Nth word line adjacent to the drain selecting line; and performing a MSB program operation for storing a higher rank data bit from the first word line adjacent to the source selecting line to the Nth word line adjacent to the drain selecting line. The LSB program operation includes: selecting a given word line, and programming first memory cells coupled to the first bit line of the selected word line and then second memory cells coupled to the second bit line of the select word line, wherein the selecting-a-given-word-line step and the programming-first-memory-cells step are repeated until the Nth word line has been processed. The first bit line is an even bit line, and the second bit line is an odd bit line.

In one embodiment, the MSB program operation includes selecting a given word line, and programming first memory cells coupled to the first bit line of the selected word line and then second memory cells coupled to the second bit line of the select word line, wherein the selecting-a-given-word-line step and the programming-first-memory-cells step are repeated until the Nth word line has been processed. The LSB program operation uses a method of incrementally increasing a word line voltage that is smaller than a word line voltage used for the MSB program operation.

In another embodiment, a method of programming a NAND flash memory device includes providing a flash memory device, wherein word lines are disposed between a drain selecting line and a source selecting line, wherein a first word line is provided adjacent to the source selecting line and a last word line is provided adjacent to the drain selecting line; and selecting a word line to program memory cells coupled to the selected word line to perform an even LSB program operation and an odd LSB program operation for the selected first word line. Each of the word lines is selected until all of the word lines have been selected, so that the even LSB program operation and the odd LSB program operation can be performed for all of the word lines. The even LSB program operation is performed to store a lower rank data bit in memory cells coupled to an even bit line assigned a selected word line. The odd LSB program operation is performed to store a lower rank data bit in memory cells coupled to an odd bit line assigned to the selected word line.

In another embodiment, the word lines are selected sequentially from the first word line until the last word line has been selected. The method further includes performing an even MSB program operation for storing a higher rank data bit in the memory cells coupled to the even bit line of the selected word line; and performing an odd MSB program operation for storing a higher rank data bit in memory cells coupled to the odd bit line of the selected word line, wherein the even MSB program operation and the odd MSB program operation are performed for each selected word line until the even MSB program operation and the odd MSB program operation have been performed for all of the selected word lines. The LSB program operation uses a method of incrementally increasing a word line voltage that is smaller than a word line voltage used for the MSB program operation.

SUMMARY OF THE INVENTION

It is a feature of the present invention to provide a method of programming a NAND flash memory which reduces the interference between cells.

A method of programming a NAND flash memory device according to one embodiment of the present invention includes providing a flash memory device where word lines are disposed between a drain selecting line and a source selecting line; performing a LSB program operation for storing lower rank data bit from a first word line adjacent to the source selecting line of the word lines to a second word line adjacent to the drain selecting line of the word lines; and performing MSB program operation for storing higher rank data bit from the first word line to the second word line. Here, memory cells coupled to one bit line of an even bit line and an odd bit line of memory cells coupled to one word line is programmed after memory cells coupled to other bit line of the memory cells coupled to the word line is programmed when performing the LSB program operation or the MSB program operation.

A method of programming a NAND flash memory device according to another embodiment of the present invention includes providing a flash memory device where word lines are disposed between a drain selecting line and a source selecting line; performing an even LSB program operation for storing a lower rank data bit in memory cells coupled to an even bit line of memory cells coupled to a first word line adjacent to the source selecting line; performing odd LSB program operation for storing lower rank data bit in memory cells coupled to the odd bit line of the memory cells coupled to the first word line; performing repeatedly the even LSB program operation and the odd LSB program operation from the first word line to a second word line adjacent to the drain selecting line, thereby storing lower rank data bit in every memory cells coupled to the word lines; performing even MSB program operation for storing higher rank data bit in memory cells coupled to the even bit line of memory cells coupled to the first word line; performing odd MSB program operation for storing higher rank data bit in memory cells coupled to the odd bit line of the memory cells coupled to the first word line; and Performing repeatedly the even MSB program operation and the odd MSB program operation from the first word line to a second word line adjacent to the drain selecting line, thereby storing the higher rank data bit in every memory cells coupled to the word lines.

A method of programming a flash memory device having multi level cell wherein higher rank data bit and lower rank data bit correspond to four threshold voltage distributions according to still another embodiment of the present invention includes programming the lower rank data bit and the higher rank data bit, wherein data storing conditions of 2 bits, i.e. "11", "01", "10" and "00" correspond to the first to fourth threshold voltage levels, respectively.

As described above, a method of programming a NAND flash memory according to one embodiment of the present invention changes the programming operation, and so interference between cells is reduced. As a result, MLC may have adequate threshold voltage level margins in accordance with the reduction of the interference, thereby reducing the read margin.

DESCRIPTION OF SPECIFIC EMBODIMENTS

Figure 1:
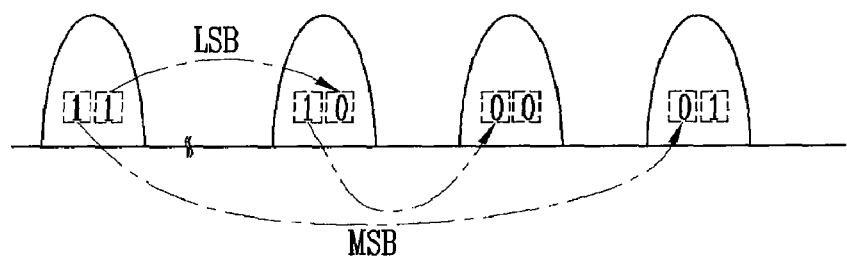
FIG. 1 is a view illustrating a method of programming a common flash memory device.
Figure 2A:
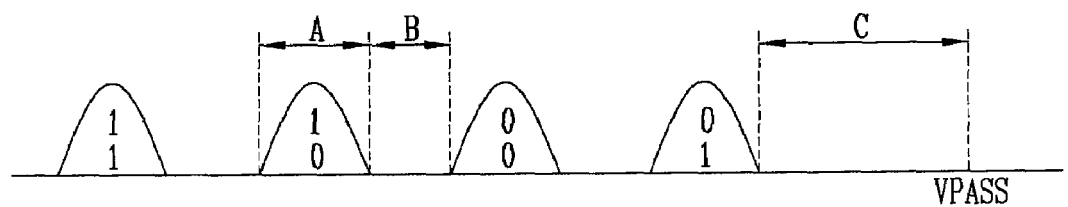
FIG. 2A is a view illustrating a common threshold voltage distribution.
Figure 2B:
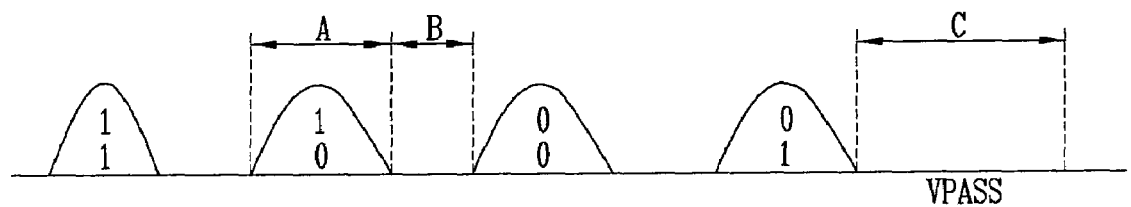
FIG. 2B is a view illustrating the increase of the threshold voltage distribution due to augmentation of interference.
Figure 3:
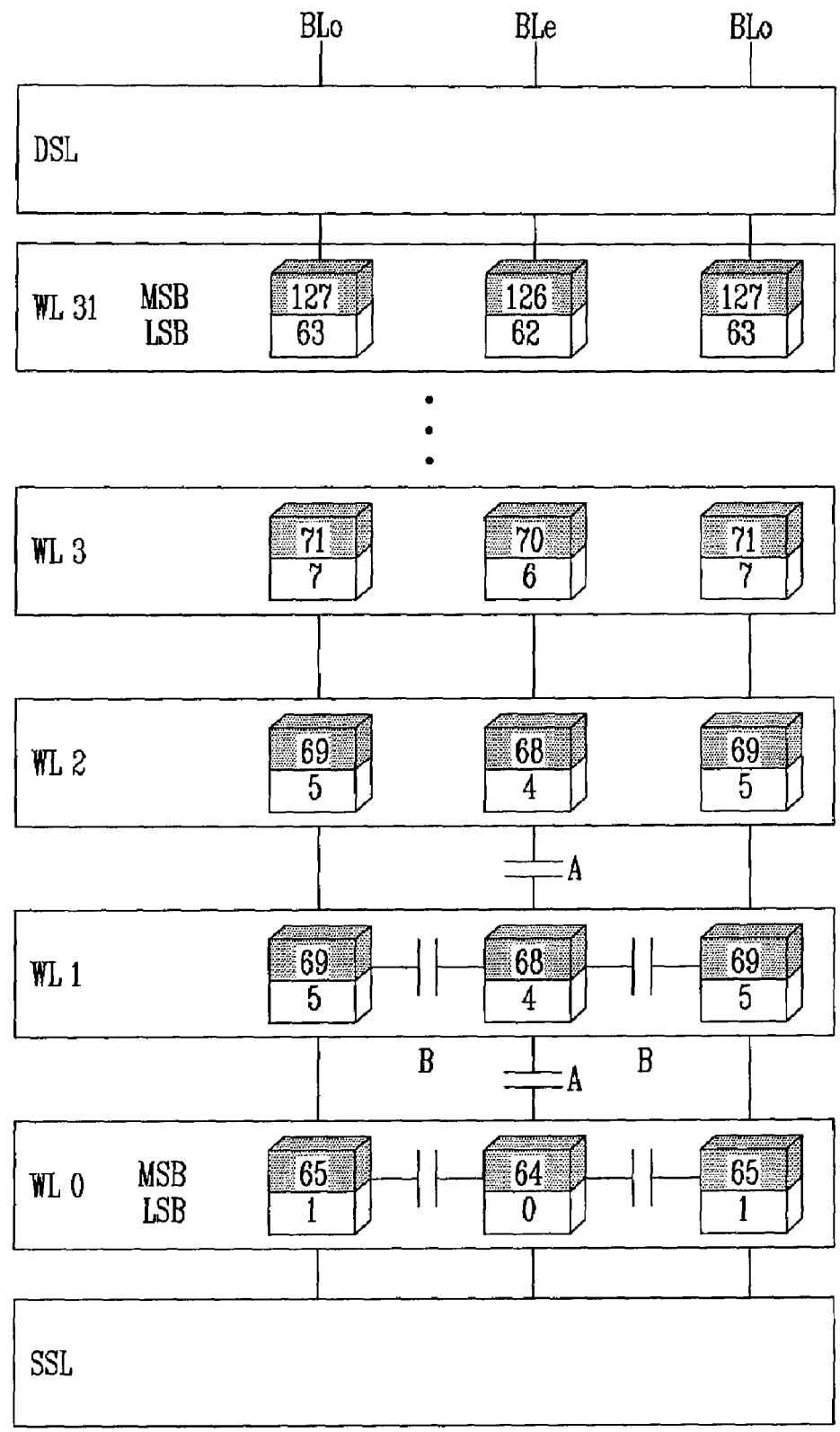
FIG. 3 is a view illustrating schematically a memory cell array using multi level cell (MLC)

FIG. 3 is a view illustrating schematically a memory cell array using multi level cell (MLC). A plurality of word lines WL0, WL1 . . . WL31 are formed between a drain selecting line DSL and a source selecting line SSL.

First, an even LSB program operation (0) is performed to store a lower rank data bit in memory cells coupled to an even bit line BLe that is coupled to the word line WL0 adjacent to the source selecting line SSL.

Next, an odd LSB program operation (1) is performed to store the lower rank data bit in memory cells coupled to odd bit lines BLo of that is coupled to the word line WL0.

The even LSB program operation and odd LSB program operation (0 to 63) are repeatedly performed from the word line WL0 to word line WL31. As a result, the lower rank data bits are stored in all of the memory cells coupled to the word lines WL0, WL1 . . . WL31. That is, the even LSB program operation and odd LSB program operation (0 to 63) are performed from the word line WL0 adjacent to the source selecting line SSL to the word line WL31 adjacent to the drain selecting line DSL.

Then, the even MSB program operation (64) is performed to store a higher rank data bit in memory cells coupled to the even bit line BLe that is coupled to the word line WL0.

An odd MSB program operation (65) is performed to store a higher rank data bit in memory cells coupled to the odd bit line BLo that is coupled to the word line WL0.

The even MSB program operation and odd MSB program operation (64 to 127) are repeatedly performed from the word line WL0 to word line WL31. As a result, higher rank data bits are stored in all of the memory cells coupled to the word lines WL0, WL1 ... WL31. In other words, the even MSB program operation and odd MSB program operation (64 to 127) are performed from the word line WL0 to the word line WL31 in ascending sequence.

In case of performing the above program operation, interference "B" between adjacent memory cells connected to the same word line may be reduced. Since these adjacent memory cells share the same word line, the same voltage is applied to them. The program voltage is applied to the memory cells via the word line. Therefore, the interference between the memory cells assigned to the same word line may be minimized.

Figure 4:
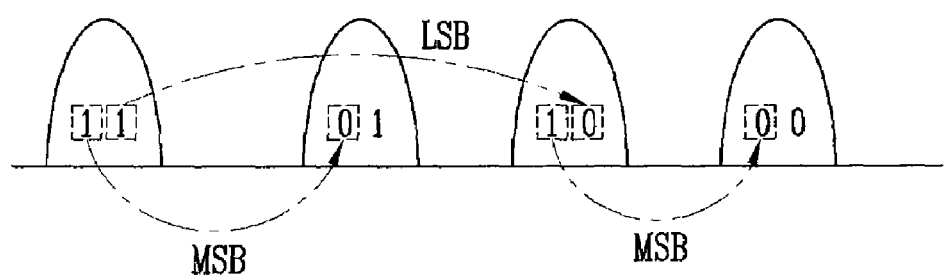
FIG. 4 is a view illustrating a method of programming the NAND flash memory device according to one embodiment of the present invention.

FIG. 4 is a view illustrating a method of programming the NAND flash memory device according to one embodiment of the present invention. The 2 bit data storing conditions have the following states: '11', '01', '10' and '00'. That is, the threshold voltage levels go from high to low in the following order '11', '01', '10' and '00'. Hence, '11' is converted into '10' when programming the LSB. In addition, '11' is converted into '01', or '10' is converted into '00' when programming the MSB.

When programming the NAND flash memory using the above program operation, interference between a '11' cell and a '10' cell is increased slightly. However, if a '11' cell is being erased, the interference to the '11' cell may be ignored because adequate margin is formed between the read line and the '11' cell. Additionally, in case of performing the above program operation, the interference is reduced between the cells in the "A" direction of FIG. 3 (i.e., the corresponding cells assigned to different word lines).

Hereinafter, two methods for compensating the interference of a '10' cell due to the above operation is explained. First, the threshold voltage distribution increased by the interference of '10' cell is compensated by adding space. This will be described in detail with reference to the accompanying drawing FIG. 5.

Figure 5:
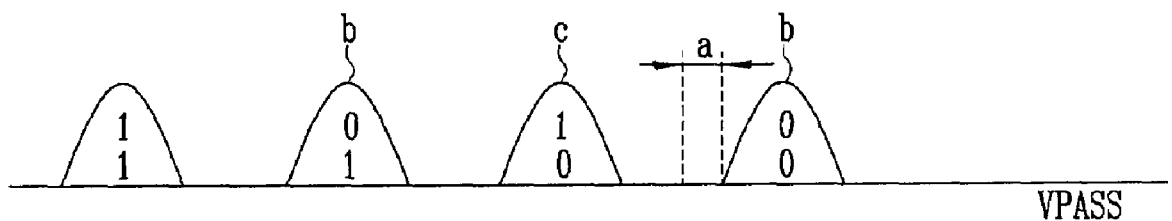
FIG. 5 is a view illustrating a process of compensating threshold voltage distribution increased by the interference of '10' cell using a method of adding read margin.

FIG. 5 is a view illustrating a process of compensating a threshold voltage distribution increased by the interference of a '10' cell using a method to add an additional read margin. To compensate the threshold voltage distribution of a '10' cell, an additional read margin 'a' between the '10' state and the '00' state is added.

The threshold voltage distributions (b) of the '01' cell and the '00' cell are reduced in half compared with those in the conventional art due to the operation shown in FIG. 4, and the threshold voltage distribution (c) is increased compared with that in the conventional art. Here, since the threshold voltage distributions (b) of the '01' cell and the '00' cell are reduced in half, all the read margins may be reduced compared with that in the conventional art even though the "a" margin between the '10' state and the '00' state is added.

Second, the threshold voltage distribution increased by the interference of a '10' cell is compensated by using an incremental step pulse program (hereinafter, referred to as "ISPP") method. The threshold voltage distribution of a '10' cell is compensated by using the ISPP method of increasing the word line voltage in incremental steps, programming and then verifying the programming of the '10' cell, i.e. programming LSB so as to compensate the threshold voltage distribution of the '10' cell. In other words, the threshold voltage distribution increased by the interference of the "10" cell is reduced by the following: (1) applying a word line voltage to program LSB where the voltage applied is lower than that applied to program MSB, programming with incremental increase in the applied word line voltage, and verifying the programming.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the scope of one skilled in the art to affect such feature, structure, or characteristic in connection with other embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of programming a NAND flash memory device comprising:

providing a flash memory device where word lines are disposed between a drain selecting line and a source selecting line, wherein a first word line is provided adjacent to the source selecting line and a last word line is provided adjacent to the drain selecting line;

selecting a word line to program memory cells coupled to the selected word line to perform an even LSB program operation and an odd LSB program operation for the selected first word line;

wherein each of the word lines is selected until all of the word lines have been selected, so that the even LSB program operation and the odd LSB program operation are performed for all of the word lines, wherein the even LSB program operation is performed to store a lower rank data bit in memory cells coupled to an even bit line assigned a selected word line, and wherein the odd LSB program operation is performed to store a lower rank data bit in memory cells coupled to an odd bit line assigned to the selected word line.

2. The method of claim 1, wherein the word lines are selected sequentially from the first word line until the last word line has been selected.

3. The method of claim 1, further comprising:

performing an even MSB program operation for storing a higher rank data bit in the memory cells coupled to the even bit line of the selected word line;

performing an odd MSB program operation for storing a higher rank data bit in memory cells coupled to the odd bit line of the selected word line, wherein the even MSB program operation and the odd MSB program operation are performed for each selected word line until the even MSB program operation and the odd MSB program operation have been performed for all of the selected word lines.

4. The method of claim 1, wherein the LSB program operation uses a method of incrementally increasing a word line voltage that is smaller than a word line voltage used for the MSB program operation.

5. The method of claim 1, wherein the even LSB program operation is performed before the odd LSB program operation.

6. The method of claim 1, wherein the even MSB program operation is programmed before the odd MSB program operation.

* * * * *